US011114631B2

(12) United States Patent
Guo et al.

(10) Patent No.: US 11,114,631 B2
(45) Date of Patent: Sep. 7, 2021

(54) FLEXIBLE DISPLAY SUBSTRATE, MANUFACTURING METHOD THEREOF, AND FLEXIBLE DISPLAY DEVICE

(71) Applicant: BOE TECHNOLOGY GROUP CO., LTD., Beijing (CN)

(72) Inventors: Yuanzheng Guo, Beijing (CN); Pinfan Wang, Beijing (CN); Ming Che Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/622,525

(22) PCT Filed: Apr. 18, 2019

(86) PCT No.: PCT/CN2019/083276
§ 371 (c)(1),
(2) Date: Dec. 13, 2019

(87) PCT Pub. No.: WO2019/233197
PCT Pub. Date: Dec. 12, 2019

(65) Prior Publication Data
US 2020/0212324 A1 Jul. 2, 2020

(30) Foreign Application Priority Data

Jun. 5, 2018 (CN) .......................... 201810569901.0

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3276* (2013.01); *H01L 51/5237* (2013.01); *H01L 51/56* (2013.01); *H01L 2251/5338* (2013.01)

(58) Field of Classification Search
CPC ......... H01L 2251/5338; H01L 51/0097; H01L 27/3262; H01L 23/4985; H01L 23/5387;
(Continued)

(56) References Cited

U.S. PATENT DOCUMENTS 9,391,294 B1 * 7/2016 Xiao ................... H01L 51/5246
10,435,289 B2 10/2019 Cotton et al.
(Continued)

FOREIGN PATENT DOCUMENTS

CN 103489823 A 1/2014
CN 106129269 A 11/2016
(Continued)

*Primary Examiner* — Jonathan Han
(74) *Attorney, Agent, or Firm* — Dilworth & Barrese, LLP.; Michael J. Musella, Esq.

(57) ABSTRACT

Embodiments of the present disclosure provide a flexible display substrate, a manufacturing method thereof and a flexible display device. The manufacturing method includes: forming a plurality of protrusions on a base substrate; forming a base film at one side of the plurality of protrusions facing away from the base substrate; forming a display structure at a surface of the base film facing away from the base substrate; peeling off the base film along with the display structure from the base substrate, and remaining the plurality of protrusions on the base substrate; and attaching the surface of the base film facing away from the display structure onto an elastic substrate and stretching the elastic substrate so that the base film is fractured at positions of the plurality of concaves.

13 Claims, 4 Drawing Sheets

(51) Int. Cl.
*H01L 51/52* (2006.01)
*H01L 51/56* (2006.01)

(58) Field of Classification Search
CPC . H01L 27/3276; H01L 51/5237; H01L 51/56; H01L 51/5253; H01L 27/12; H01L 21/84; G06F 1/1652; Y02E 10/549
USPC .............................. 257/40, E23.177, 88, 749
See application file for complete search history.

(56) References Cited

U.S. PATENT DOCUMENTS

| | | | |
|---|---|---|---|
| 2010/0330338 A1* | 12/2010 | Boyce | B29C 59/02 |
| | | | 428/156 |
| 2013/0328071 A1 | 12/2013 | Tanaka | |
| 2014/0144480 A1* | 5/2014 | Lee | H01L 31/048 |
| | | | 136/244 |
| 2016/0268352 A1* | 9/2016 | Hong | H01L 27/326 |
| 2018/0047921 A1* | 2/2018 | Seo | H01L 51/0097 |
| 2018/0052493 A1* | 2/2018 | Hong | B32B 3/266 |
| 2018/0174523 A1* | 6/2018 | Jeon | H01L 51/0097 |

FOREIGN PATENT DOCUMENTS

| | | | |
|---|---|---|---|
| CN | 107001027 A | 8/2017 | |
| CN | 107831941 A | 3/2018 | |
| CN | 108054173 A | 5/2018 | |
| CN | 108550587 A | 9/2018 | |

* cited by examiner

FLEXIBLE DISPLAY SUBSTRATE, MANUFACTURING METHOD THEREOF, AND FLEXIBLE DISPLAY DEVICE

The present application claims priority of China Patent application No. 201810569901.0 filed on Jun. 5, 2018, the content of which is incorporated in its entirety as portion of the present application by reference herein.

TECHNICAL FIELD

Embodiments of the present disclosure relate to a flexible display substrate, a manufacturing method thereof, and a flexible display device.

BACKGROUND

Flexible displayer may be applied in the fields of wearable display apparatus, Internet of Things (ITO) apparatus, vehicle, artificial intelligence application and the like, and has been widely concerned and studied in recent years.

The flexible displayer may be of various types such as an arc-shaped displayer, a collapsible displayer, a bendable displayer and a stretchable flexible displayer. The stretchable flexible displayer possesses the advantages that it can be pressed or stretched according to its original planar shape under the premise of guaranteeing an image quality. Such characteristic makes the stretchable flexible displayer applicable not only for an eye-catching mobile phone but also for a wearable display apparatus such as a smartwatch and a fitness tracker.

Currently, due to restrictions of high degree of difficulty, complicated manufacturing process, expensive cost and the like, technology of the stretchable flexible displayer is not yet mature and cannot achieve mass production.

SUMMARY

At least one embodiment of the present disclosure provides a flexible display substrate, a manufacturing method thereof and a flexible display device, which can reduce the technical difficulty and technical complexity of manufacturing a stretchable flexible displayer and also lower the cost, so as to facilitate the mass production of the stretchable flexible displayer.

In order to achieve the objectives above, embodiments of the present disclosure adopt the following technical solutions.

On the first aspect, an embodiment of the present disclosure provides a flexible display substrate, including: an elastic substrate; a base film provided at one side of the elastic substrate, the base film being provided with a plurality of fracture structures; and a display substrate provided at a surface of the base film facing away from the elastic substrate, wherein an orthographic projection of the display structure on the elastic substrate has no overlap area with an orthographic projection of the fracture structure on the elastic substrate.

Optionally, the fracture structure has a fracture position, the fracture position is located at one side of the base film facing away from the elastic substrate, and the orthographic projection of the fracture structure on the elastic substrate has a strip shape.

Optionally, the plurality of fracture structures are arranged in an array and include multiple first fracture structures and multiple second fracture structures; the first fracture structures are arranged alternately with the second fracture structures; and an extending direction of a length of the first fracture structure is perpendicular to an extending direction of a length of the second fracture structure.

Optionally, the plurality of fracture structures define a plurality of display unit regions, and the display structure includes: a plurality of thin film transistors (TFTs) correspondingly provided in the plurality of display unit regions; a plurality of signal lines arranged to bypass the plurality of fracture structures; a plurality of light-emitting elements provided at one side of the plurality of TFTs facing away from the elastic substrate and correspondingly provided in the plurality of display unit regions; and a plurality of encapsulation structures provided at one side of the plurality of light-emitting elements facing away from the elastic substrate, each of the plurality of encapsulation structures is configured to encapsulate at least one light-emitting element therein, and an orthographic projection of the encapsulation structure on the elastic substrate has no overlap area with the orthographic projection of the fracture structure on the elastic substrate.

Optionally, a material of the base film is polyimide.

On the second aspect, an embodiment of the present disclosure provides manufacturing method of a flexible display substrate, including: forming a plurality of protrusions on a base substrate; forming a base film at one side of the plurality of protrusions facing away from the base substrate, so that a plurality of concaves is formed by the plurality of protrusions at one side of the base film facing to the base substrate; forming a display structure at a surface of the base film facing away from the base substrate; peeling off the base film along with the display structure from the base substrate, and remaining the plurality of protrusions on the base substrate; and attaching the surface of the base film facing away from the display structure onto an elastic substrate and stretching the elastic substrate so that the base film is fractured at positions of the plurality of concaves.

Optionally, forming the plurality of protrusions on the base substrate includes: forming a pattern of plurality of protrusions on the base substrate by using a glass cement; finalizing a shape of the pattern of plurality of protrusions; and solidifying the glass cement to obtain the plurality of protrusions.

Optionally, forming the plurality of protrusions on the base substrate includes: coating a patterned glass cement on the base substrate by a screen printing process to obtain the pattern of plurality of protrusions; baking the pattern of plurality of protrusions to thermally solidify the pattern of plurality of protrusions so as to finalize a shape of the pattern of plurality of protrusions; and solidifying the glass cement by a laser scanning process to obtain the plurality of protrusions.

Optionally, the protrusion has a strip structure.

Optionally, the plurality of protrusions are arranged in an array and include multiple first protrusions and multiple second protrusions; the first fracture protrusions are arranged alternately with the second protrusions; and an extending direction of a length of the first protrusion is perpendicular to an extending direction of a length of the second protrusion.

Optionally, a thickness of the base film is greater than a height of the protrusion.

Optionally, forming the display structure at the surface of the base film facing away from the base substrate includes: forming a plurality of thin film transistors (TFTs) and a plurality of signal lines on the surface of the base film facing away from the base substrate, so that positions of the plurality of TFTs correspond to areas between the plurality of concaves and that the plurality of signal lines are arranged to bypass the plurality of concaves; forming a plurality of light-emitting elements at one side of the plurality of TFTs facing away from the base substrate; and forming a plurality of encapsulation structures at one side of the plurality of light-emitting elements facing away from the base substrate so that each of the plurality of encapsulation structures encapsulates at least one light-emitting element therein and that an orthographic projection of the encapsulation structure on the base film has no overlap area with an orthographic projection of the concave on the base film.

Optionally, after forming the plurality of protrusions and before forming the base film, the manufacturing method further includes: forming a debonding layer at the side of the plurality of protrusions facing away from the base substrate.

Optionally, a material of the debonding layer is silicon nitride.

On the third aspect, an embodiment of the present disclosure provides a flexible display device, including the flexible display substrate according to the first aspect.

BRIEF DESCRIPTION OF THE DRAWINGS

Hereinafter, the drawings necessary for the explanation of embodiments of the present disclosure or the prior art are simply introduced in order to more clearly explain technical solution(s) of the embodiments of the present disclosure or the prior art. Obviously, the described drawings below are merely related to some of the embodiments of the present disclosure. For those ordinary skilled in the art, other drawings may be obtained therefrom without any creative labors. In the drawings.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. "On," "under," and the like are only used to indicate relative position relationship, and when the position of the described object is changed, the relative position relationship may be changed accordingly.

An embodiment of the present disclosure provides a manufacturing method of a flexible display substrate. As illustrated in FIGS. 1-6b, the manufacturing method may include the following steps S1-S5.

Figure 1:
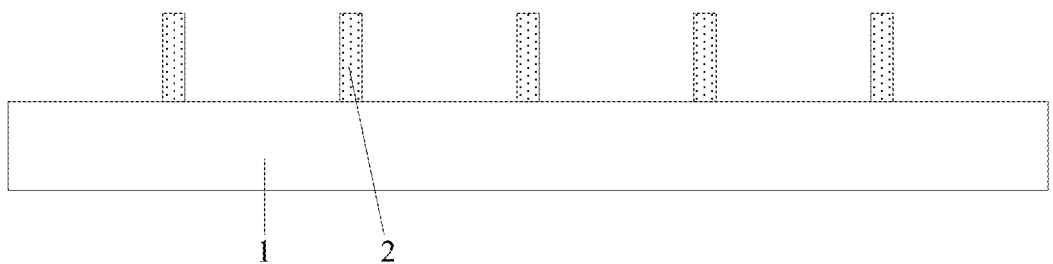
FIG. 1-FIG. 6b are schematic views illustrating respective steps of a manufacturing method of a flexible display substrate provided by an embodiment of the present disclosure.

S1, as illustrated in FIG. 1, forming a plurality of protrusions 2 on a base substrate 1.

As a possible implementation, the above-described step S1 may include the following steps S11-S13.

S11, forming a pattern of plurality of protrusions 2 on the base substrate 1 by using a glass cement.

For example, a patterned glass cement may be directly coated onto the base substrate 1 by screen printing process to obtain the pattern of plurality of protrusions.

In the embodiment of the present disclosure, forming a pattern of plurality of protrusions may be achieved by directly coating a patterned glass cement through a screen printing process. This step avoids using a photoetching process for patterning; as a result, the technical step is simple and easy to implement.

S12, finalizing a shape of the pattern of plurality of protrusions 2.

For example, the pattern of plurality of protrusions 2 formed by glass cement material may be baked so as to be thermally solidified, and then a shape of the pattern of plurality of protrusions 2 may be finalized. This step only uses a baking process, which is simple and easy to implement.

S13, solidifying the glass cement to obtain a plurality of protrusions 2.

For example, the plurality of protrusions 2 formed by glass cement material may be subject to a laser scanning process so that the glass cement is solidified. Such solidification process, essentially, is a process converting the glass cement, which is an inorganic substance, to an organic substance. This step merely uses a laser scanning process, and hence is simple and easy to implement. Moreover, the glass cement will be changed into glass upon solidification; that is, the finally obtained protrusion 2 is made of glass material, which makes it easier for a base film formed in the subsequent steps to be separated from the protrusion 2.

Figure 7:
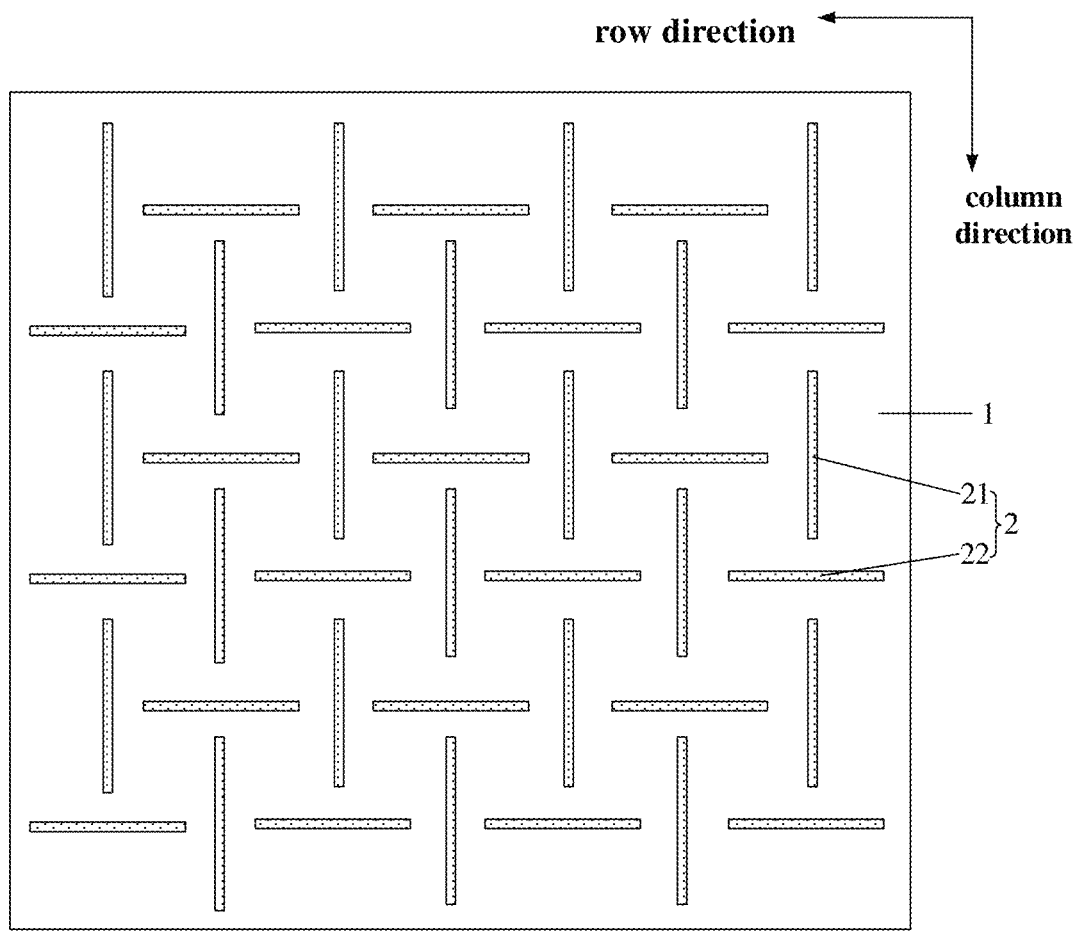
FIG. 7 is a plan view illustrating a plurality of protrusions formed in a manufacturing method of a flexible display device provided by an embodiment of the present disclosure.

Referring to FIG. 7, the protrusion 2 formed in step S1 may be a strip structure.

In the embodiment of the present disclosure, an arrangement of the plurality of protrusions 2 on the base substrate 1 may be configured according to an arrangement of fracture structures in the flexible display substrate to be manufactured. Furthermore, the arrangement of the fracture structures in the flexible display substrate to be manufactured is relevant to a stretchable direction of the flexible display substrate to be manufactured. For example, the stretchable direction of the flexible display substrate to be manufactured may be a transverse direction only, or may be a lengthways direction only, or may be both of the transverse direction and the lengthways direction, or may be radial directions from a center of the flexible display substrate towards all around, or the like; correspondingly, when the flexible display substrate is stretched along a target direction, the fracture structure thereof may provide a deformation amount along the target direction.

Still referring to FIG. 7, as a possible implementation, the plurality of protrusions 2 may be arranged as below: the plurality of protrusions 2 are arranged in an array, including multiple first protrusions 21 and multiple second protrusions 22; in each of rows, the first protrusions 21 are arranged alternately with the second protrusions 22; in each of columns, the first protrusions 21 are also arranged alternately with the second protrusions 22; an extending direction of a length of the first protrusion 21 is perpendicular to an extending direction of a length of the second protrusion 22. For example, the lengths of the multiple first protrusions 21 may extend along the column direction, and the lengths of the multiple second protrusions 22 may extend along the row direction.

Figure 2:
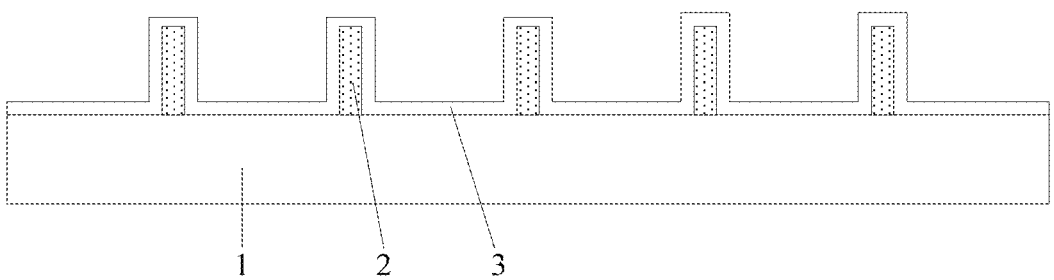

In an example, referring to FIG. 2, after the plurality of protrusions 2 are formed, a debonding layer 3 may be further formed at one side of the plurality of the protrusions 2 facing away from the base substrate 1. A material of the debonding layer 3 may be silicon nitride, or may be an organic material. The existence of the debonding layer 3 may make it easier for a base film formed in a subsequent step to be peeled off from the base substrate 1 and to be separated from the protrusions 2 and the debonding layer 3 on the base substrate 1.

Figure 3:
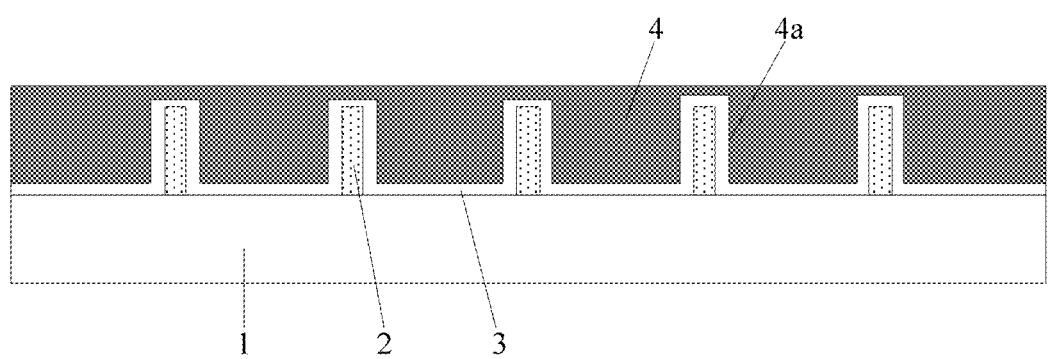

S2, as illustrated in FIG. 3, forming a base film 4 at the side of the plurality of protrusions 2 facing away from the base substrate 1, so that a plurality of concaves 4a is formed by the plurality of protrusions 2 at one side of the base film 4 facing to the base substrate 1.

In the above-described step S2, for example, the base film 4 may adopt an organic material, e.g., polyimide solution (PI solution) and the like. For example, in forming the base film 4, the PI solution may be directly coated on the plurality of protrusions 2 to form a wet PI film; and then the wet PI film as coated may be heated for solidification so as to form a dry PI film. In coating the PI solution, the existence of the plurality of protrusions 2 results in a plurality of concaves 4a to be naturally formed at the side of the base film 4 facing to the base substrate 1. The concave 41 corresponds to the protrusion 2 in both of position and structure. For example, for a protrusion 2 with a strip-like structure, the correspondingly formed concave 4a has a groove-like structure. In an embodiment of the present disclosure, forming the base film 4 only requires for a coating operation without any complicated process, which is simple to operate and easy to implement.

It should be noted that, in order to provide a good foundation for forming a display structure in subsequent steps so as to improve a performance of the display structure, a dry film thickness of the base film 4 (i.e., a thickness of the dry PI film formed in S2) may be made greater than a height of the protrusion 2, so that surfaces of the plurality of protrusions 2 are completely planarized, which provides a good foundation for forming the display structure in subsequent steps.

Figure 4A:
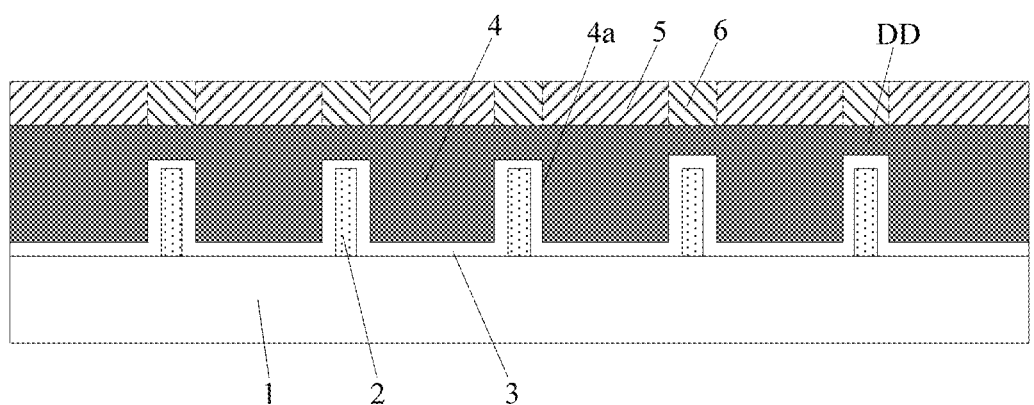
Figure 4B:
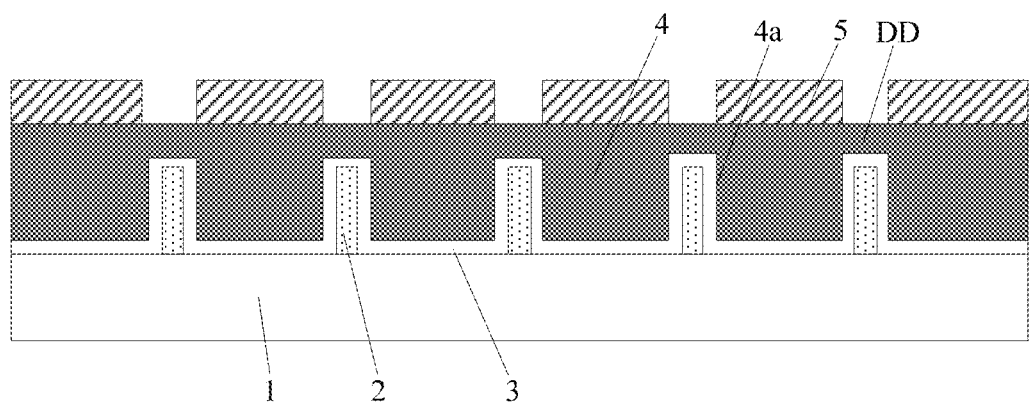

S3, as illustrated in FIGS. 4a and 4b, forming a display structure 5 on a surface of the base film 4 facing away from the base substrate 1.

As a possible implementation, the above-described step S3 may include the following steps S31-S33.

S31, forming a plurality of thin film transistors (TFTs) and a plurality of signal lines on the surface of the base film 4 facing away from the base substrate 1, so that positions of the plurality of TFTs correspond to areas between the plurality of concaves 4a and that the plurality of signal lines are arranged to bypass the plurality of concaves 4a.

It should be explained that, the plurality of signal lines may include gate lines, date lines, common electrode lines and the like, which are configured to transmit various electrical signals necessary for the display structure to perform display. During forming the signal lines, the signal lines may be arranged to bypass the concaves 4a, so that when the concaves 4a are stretched to be fractured in the subsequent steps and when the flexible display substrate as manufactured is stretched for use, the signal lines would not be fractured by the stretching operation.

In an example, referring to FIG. 4a, the step of forming the plurality of TFTs and the plurality of signal lines may further include at least one step of forming an insulating layer 6. The insulating layer 6 may be of various types. For example, the step of forming the insulating layer 6 may include: a step of forming a gate insulating layer between a gate electrode layer and an active layer of the TFT; a step of forming an interlayer insulating layer 6 between the active layer and a drain-source electrode layer; a step of forming a passivation layer 6 on the drain-source electrode layer or the like. In each of the above-described steps of forming the insulating layer 6, for example, firstly, an insulating material may be deposited to form an insulating layer film 6; and then the insulating layer film 6 may be patterned, as illustrated in FIG. 4b, to remove the insulating material in positions (i.e., DD illustrated in FIG. 4a) of the insulating layer film 6 corresponding to the plurality of concaves 4a. By removing the insulating material in the positions (DD) of the insulating layer film 6 corresponding to the plurality of concaves 4a, only the base film 4 is remained above the plurality of concaves 4a, so as to ensure that when the flexible display substrate as manufactured is stretched in the subsequent steps, the base film 4 may be easily fractured at the positions (DD) of the plurality of concaves 4a.

S32, forming a plurality of light-emitting elements at one side of the plurality of TFTs facing away from the base substrate 1.

The light-emitting element as formed in this step may be, for example, an organic light-emitting diode (OLED), and a process of forming the light-emitting element may include, for example, steps of forming a plurality of anodes, a plurality of light-emitting layers and a plurality of cathodes sequentially.

S33, forming a plurality of encapsulation structures at one side of the plurality of light-emitting elements facing away from the base substrate 1 so that each of the plurality of encapsulation structures encapsulates at least one light-emitting element therein and that the plurality of encapsulation structures are arranged to bypass the plurality of concaves 4a.

The encapsulation performed in this step, essentially, is a pixel-level encapsulation. Differently from the conventional technology in which the whole surface of the OLED device is encapsulated, in this step, each of the encapsulation structures only encapsulates one or more light-emitting elements and is kept away from the positions (DD) of the concaves 4a; in this way, each of the encapsulation structures and the light-emitting element(s) encapsulated therein may constitute an independent display unit, so as to ensure that the film layer can be smoothly stretched and fractured at the position (DD) of the concaves 4a in the subsequent steps while a sealing performance of the light-emitting elements would not be damaged.

Figure 5A:
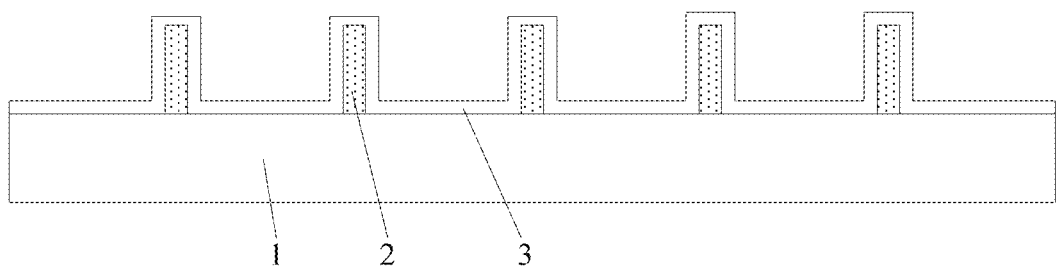
Figure 5B:
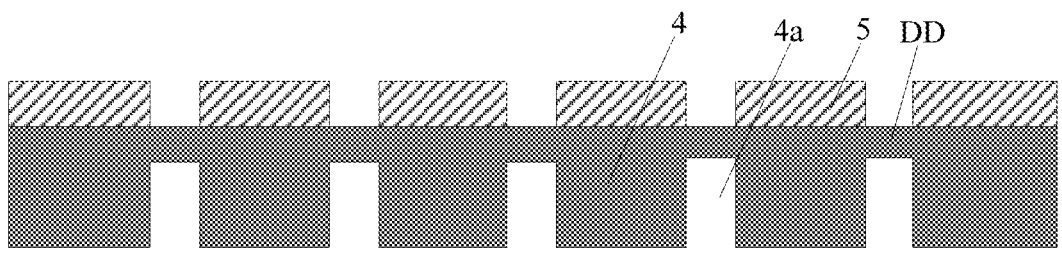

S4, as illustrated in FIGS. 5a and 5b, peeling off the base film 4 along with the display structure 5 from the base substrate 1.

In the above-described step S4, for example, the peeling-off operation may adopt Laser Lift Off (LLO) technology. It should be explained that, if the debonding layer 3 is formed, in advance, between the plurality of protrusions 2 and the base film 4, the separation of the plurality of protrusions 2 from the base film 4 may be easier and may be achieved merely by a direct, mechanical exfoliation.

Referring to FIG. 5a, after peeling off the base film 4 and the display structure 5, the plurality of protrusions 2 are remained on the base substrate 1, and one side of the base film 4 as peeled off is provided with the display structure 5 while the other side is provided with the plurality of concaves 4a.

Figure 6A:
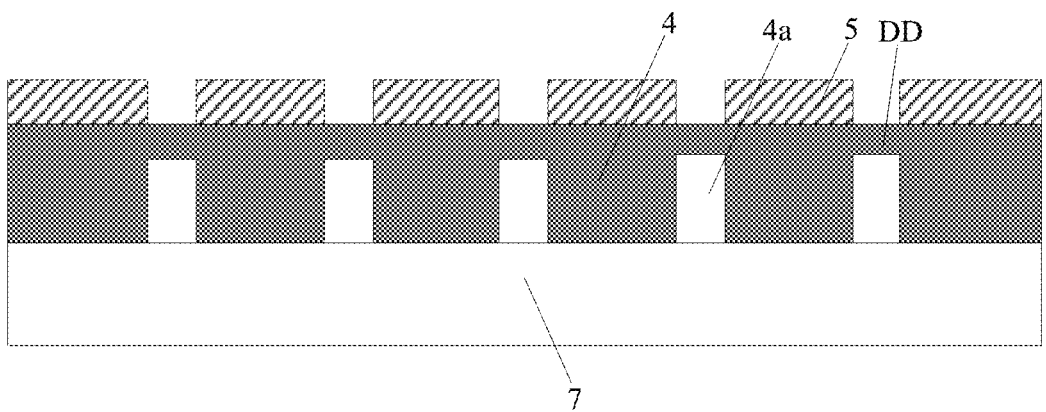
Figure 6B:
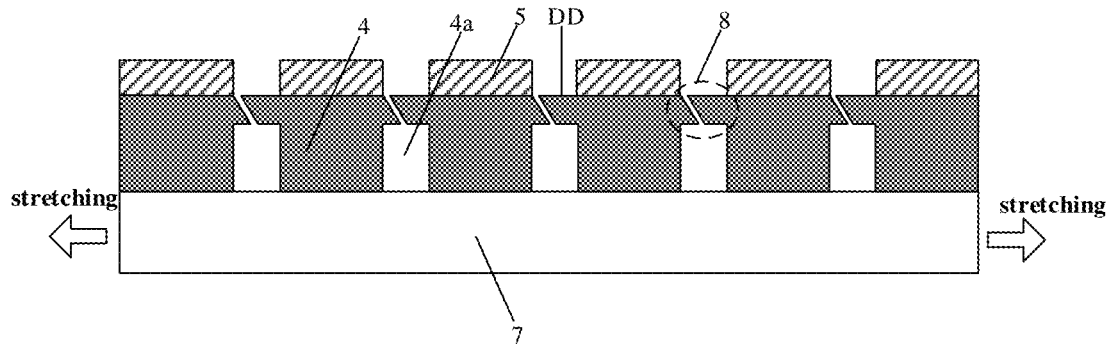

S5, as illustrated in FIGS. 6a and 6b, attaching the surface of the base film 4 facing away from the display structure 5 onto an elastic substrate 7 and stretching the elastic substrate 7 so that the base film 4 is fractured at positions (DD) of the plurality of concaves 4a.

Figure 8:
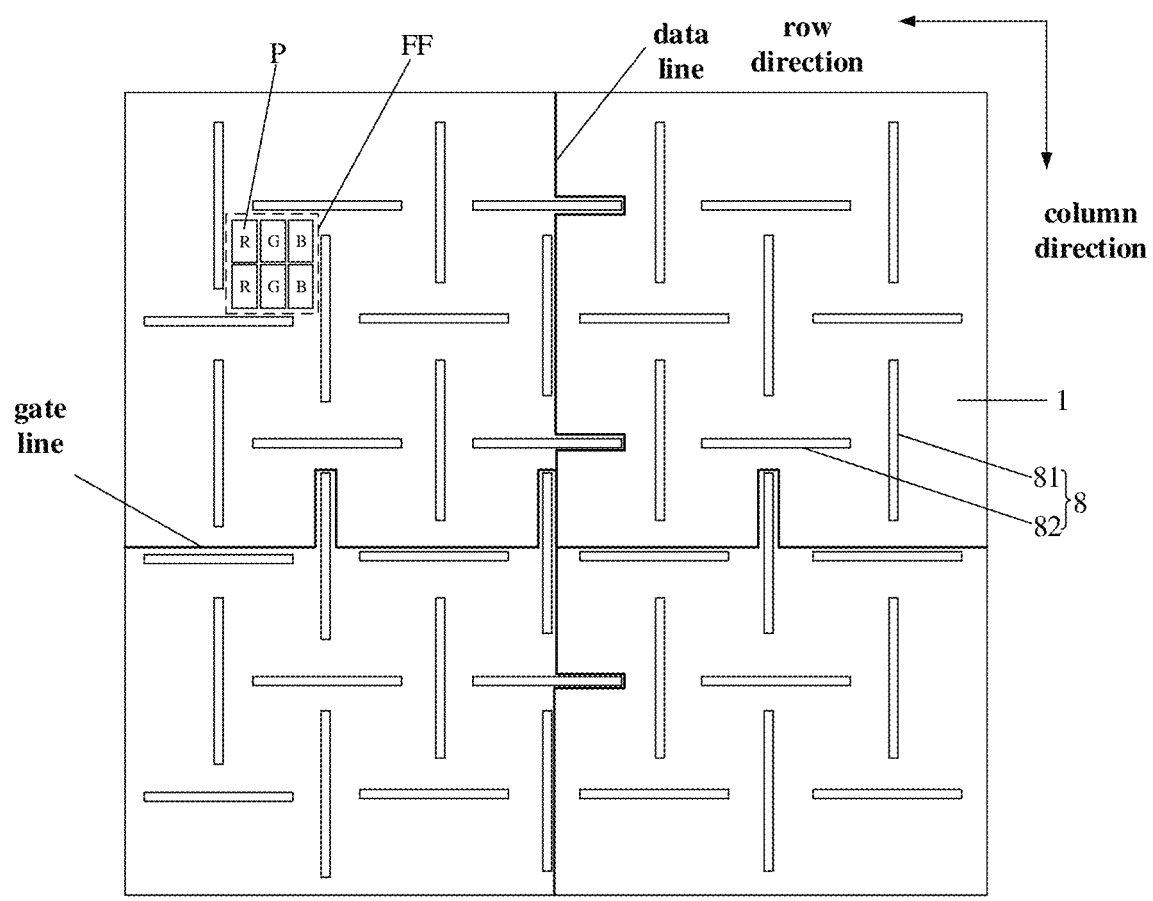
FIG. 8 is a plan view illustrating a flexible display substrate provided by an embodiment of the present disclosure.

The plurality of concaves 4a, essentially, constitute defects of the base film 4. As a result, in the above-described step S5, when stretching the elastic substrate 7, the plurality of concaves 4a would be fractured firstly, as defects, so as to form a plurality of aperture-like fracture structures 8, as illustrated in FIG. 8. During an actual usage, when the flexible display substrate is stretched, the aperture-like fracture structures 8 may generate a deformation amount along with the stretching operation, so that the flexible display substrate, as a whole, generates a deformation amount and possesses a stretchable property.

It should be explained that, in the above-described step S5, a stretching direction of the elastic substrate 7 may be configured according to the shape and the arrangement of the concaves 4a in the base film 4. For example, it may be stretched along a direction which makes it easier and smoother for the film to be fractured at the positions of the concaves 4a. For example, in the case where the concaves 4a are shaped and arranged as illustrated in FIG. 8, because the concave 4a has a groove shape and because a length direction of part of the concaves 4a extends along the column direction while a length direction of part of the concaves 4a extends along the row direction, when the elastic substrate 7 is stretched, it may be two-way stretched along the row direction so that the film is smoothly fractured at the concaves 4a having a length direction extending along the column direction; and at the same time, it may also be two-way stretched along the column direction so that the film is also smoothly fractured at the concaves 4a having a length direction extending along the row direction.

As above, through the exemplary steps S1-S5 in the present embodiment, a manufacture of a stretchable flexible display substrate is achieved, and the manufacturing method involves no complicated process; that is, the processes as adopted all require low technical level, and are easy to implement and operate, which significantly promote the development of mass production of the stretchable flexible display substrate.

Based on the same inventive concept, an embodiment of the present disclosure further provides a flexible display substrate. As illustrated in FIG. 6b and FIG. 8, the flexible display substrate may include: an elastic substrate 7; a base film 4 provided at a surface of the elastic substrate 7, the base film 4 is provided with a plurality of fracture structures 8; and a display substrate 5 provided at a surface of the base film 4 facing away from the elastic substrate 7, the display substrate 5 is arranged to bypass the plurality of fracture structures 8.

It should be explained that, "the display substrate 5 is arranged to bypass the plurality of fracture structures 8" may be achieved as below: an orthographic projection of the display structure 5 on the elastic substrate 7 has no overlap area with an orthographic projection of the fracture structure 8 on the elastic substrate 7. The above-described flexible display substrate provided by the embodiment of the present disclosure may be obtained by the above-described manufacturing method, with the advantages of simple processes and easy implementation.

In the flexible display substrate provided by the embodiment of the present disclosure, the plurality of fracture structures 8 may define a plurality of display unit regions, and these display unit regions may be part of areas between the plurality of fracture structures 8.

For example, the display structure 5 may include: a plurality of thin film transistors (TFTs) correspondingly provided in the plurality of display unit regions; a plurality of signal lines arranged to bypass the plurality of fracture structures so as to prevent the signal lines from being fractured along with a stretching operation when the flexible display substrate is stretched; a plurality of light-emitting elements provided at one side of the plurality of TFTs facing away from the base film 4 and correspondingly provided in the plurality of display unit regions, so as to form a correspondence relationship between the TFTs and the light-emitting elements located in a same display unit region in which the TFT may drive a corresponding light-emitting element to emit light; and a plurality of encapsulation structures provided at one side of the plurality of light-emitting elements facing away from the base film 4, each of the plurality of encapsulation structures is configured to encapsulate at least one light-emitting element therein, and the plurality of encapsulation structures are arranged to bypass the plurality of fracture structures 8 of the base film 4 so that each of the plurality of fracture structures 8 and the light-emitting element(s) encapsulated therein may constitute an independent display unit, which ensures the stretchable property of the flexible display substrate and also the sealing property of the light-emitting elements.

In the above-described flexible display substrate provided by the embodiment of the present disclosure, still referring to FIG. 8, as a feasible design, a fractured position of the fracture structure 8 is located at the side of the base film 4 facing away from the elastic substrate 7, and an orthographic projection of fracture structure 8 on the elastic substrate 7, as a whole, is in a strip shape. As illustrated in FIG. 6b, the fracture structure 8 may be obtained from the groove-like concave 4a which is formed in the base film 4 and is fractured by stretching.

In an example, the plurality of fracture structures 8 may be arranged as below: the plurality of fracture structures 8 are arranged in an array, including multiple first fracture structures 81 and multiple second fracture structures 82; the first fracture structures 81 are arranged alternately with the second fracture structures 82; and an extending direction of a length of the first fracture structure 81 is perpendicular to an extending direction of a length of the second fracture structure 82. For example, the length of the first fracture structure 81 may extend along the column direction, and the length of the second fracture structure 82 may extend along the row direction.

With such arrangement, the plurality of fracture structures 8 may define a plurality of display unit regions FF. Each of the display unit regions FF may be provided with at least one sub-pixel P therein. Moreover, signal lines that are configured to transmit various signals necessary for display to the sub-pixel are arranged to bypass the fracture structures 8, so as to prevent the signal lines from being fractured along with the stretching operation when the flexible display substrate is stretched. For example, in the case of gate line, when it's about to encounter the second fracture structure 82 having a length direction extending along the row direction, the gate line may bypass the second fracture structure 82 and instead be arranged at the side of the second fracture structure 82 and parallel to the second fracture structure 82; when it's about to extend through the first fracture structure 81 having a length direction extending along the column direction, the gate line may change its extending direction, for the moment, to be arranged along the column direction (i.e., parallel to the first fracture structure 81) and then restored to be arranged along the row direction (i.e., parallel to the second fracture structure 82) after bypassing the first fracture structure 81. Similarly, the data line may be arranged to be parallel to the first fracture structure 81 and bypass the first fracture structure 81.

Based on the same inventive concept, an embodiment of the present disclosure further provides a flexible display device including the flexible display substrate described in any of the embodiments above. The flexible display device possesses stretchable property, with simple manufacturing processes which are easy to implement.

The flexible display device provided by the embodiment of the present disclosure may be any product or component having displaying function such as an organic light-emitting diode (OLED) panel, a mobile phone, a tablet computer, a television, a displayer, a notebook computer, a digital photo frame, and a navigation device.

The foregoing is only specific embodiments of the present disclosure, but the protection scope of the present disclosure is not limited thereto. Any modifications or alternations easily envisaged by one person skilled in the art within the technical scope of the present disclosure should fall within the protection scope of the present disclosure. Therefore, the protection scope of the present disclosure should be based on protection scope of the claims.

What is claimed is:

1. A flexible display substrate, comprising:
   an elastic substrate;
   a base film provided at one side of the elastic substrate, the base film being provided with a plurality of fracture structures; and
   a display substrate provided at a surface of the base film facing away from the elastic substrate, wherein
   an orthographic projection of the display structure on the elastic substrate has no overlap area with an orthographic projection of the fracture structure on the elastic substrate, wherein
   the fracture structure has a fracture position, the fracture position is located at one side of the base film facing away from the elastic substrate,
   the plurality of fracture structures are arranged in an array and comprise multiple first fracture structures and multiple second fracture structures;
   the multiple first fracture structures are arranged alternately with the multiple second fracture structures;
   an extending direction of a length of the first fracture structure is perpendicular to an extending direction of a length of the second fracture structure; and
   orthographic projections of the first fracture structure and the second fracture structure on the elastic substrate both have a strip shape.

2. The flexible display substrate according to claim 1, wherein the plurality of fracture structures define a plurality of display unit regions;
   the display structure comprises:
   a plurality of thin film transistors (TFTs) correspondingly provided in the plurality of display unit regions;
   a plurality of signal lines arranged to bypass the plurality of fracture structures;
   a plurality of light-emitting elements provided at one side of the plurality of TFTs facing away from the elastic substrate and correspondingly provided in the plurality of display unit regions; and
   a plurality of encapsulation structures provided at one side of the plurality of light-emitting elements facing away from the elastic substrate, each of the plurality of encapsulation structures is configured to encapsulate at least one light-emitting element, and an orthographic projection of the encapsulation structure on the elastic substrate has no overlap area with the orthographic projection of the fracture structure on the elastic substrate.

3. The flexible display substrate according to claim 1, wherein a material of the base film is polyimide.

4. A flexible display device, comprising the flexible display substrate according to claim 1.

5. The flexible display device according to claim 4, wherein the plurality of fracture structures define a plurality of display unit regions;
   the display structure comprises:
   a plurality of thin film transistors (TFTs) correspondingly provided in the plurality of display unit regions;
   a plurality of signal lines arranged to bypass the plurality of fracture structures;
   a plurality of light-emitting elements provided at one side of the plurality of TFTs facing away from the elastic substrate and correspondingly provided in the plurality of display unit regions; and
   a plurality of encapsulation structures provided at one side of the plurality of light-emitting elements facing away from the elastic substrate, each of the plurality of encapsulation structures is configured to encapsulate at least one light-emitting element, and an orthographic projection of the encapsulation structure on the elastic substrate has no overlap area with the orthographic projection of the fracture structure on the elastic substrate.

6. The flexible display device according to claim 4, wherein a material of the base film is polyimide.

7. A manufacturing method of a flexible display substrate, comprising:
   forming a plurality of protrusions on a base substrate;
   forming a base film at one side of the plurality of protrusions facing away from the base substrate, so that a plurality of concaves is formed by the plurality of protrusions at one side of the base film facing to the base substrate;
   forming a display structure at a surface of the base film facing away from the base substrate;
   peeling off the base film along with the display structure from the base substrate, and remaining the plurality of protrusions on the base substrate; and
   attaching the surface of the base film facing away from the display structure onto an elastic substrate and stretching the elastic substrate so that the base film is fractured at positions of the plurality of concaves, wherein the plurality of protrusions are arranged in an array and comprise multiple first protrusions and multiple second protrusions;

the multiple first fracture protrusions are arranged alternately with the multiple second protrusions;

an extending direction of a length of the first protrusion is perpendicular to an extending direction of a length of the second protrusion; and the first fracture protrusion and the second protrusion both have a strip structure.

8. The manufacturing method of the flexible display substrate according to claim 7, wherein forming the plurality of protrusions on the base substrate comprises:

forming a pattern of plurality of protrusions on the base substrate by using a glass cement;

finalizing a shape of the pattern of plurality of protrusions; and solidifying the glass cement to obtain the plurality of protrusions.

9. The manufacturing method of the flexible display substrate according to claim 8, wherein forming the plurality of protrusions on the base substrate comprises:

coating a patterned glass cement on the base substrate by a screen printing process to obtain the pattern of plurality of protrusions;

baking the pattern of plurality of protrusions to thermally solidify the pattern of plurality of protrusions so as to finalize a shape of the pattern of plurality of protrusions; and solidifying the glass cement by a laser scanning process to obtain the plurality of protrusions.

10. The manufacturing method of the flexible display substrate according to claim 7, wherein a thickness of the base film is greater than a height of the protrusion.

11. The manufacturing method of the flexible display substrate according to claim 7, wherein forming the display structure at the surface of the base film facing away from the base substrate comprises:

forming a plurality of thin film transistors (TFTs) and a plurality of signal lines on the surface of the base film facing away from the base substrate, so that positions of the plurality of TFTs correspond to areas between the plurality of concaves and that the plurality of signal lines are arranged to bypass the plurality of concaves;

forming a plurality of light-emitting elements at one side of the plurality of TFTs facing away from the base substrate; and forming a plurality of encapsulation structures at one side of the plurality of light-emitting elements facing away from the base substrate so that each of the plurality of encapsulation structures encapsulates at least one light-emitting element therein and that an orthographic projection of the encapsulation structure on the base film has no overlap area with an orthographic projection of the concave on the base film.

12. The manufacturing method of the flexible display substrate according to claim 7, wherein after forming the plurality of protrusions and before forming the base film, the manufacturing method further comprises:

forming a debonding layer at the side of the plurality of protrusions facing away from the base substrate.

13. The manufacturing method of the flexible display substrate according to claim 12, wherein a material of the debonding layer is silicon nitride.

* * * * *